United States Patent
Mazoyer et al.

(10) Patent No.: US 8,410,539 B2
(45) Date of Patent: Apr. 2, 2013

(54) MOS TRANSISTOR WITH A SETTABLE THRESHOLD

(75) Inventors: Pascale Mazoyer, Domene (FR); Germain Bossu, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 637 days.

(21) Appl. No.: 12/279,056

(22) PCT Filed: Feb. 14, 2007

(86) PCT No.: PCT/FR2007/050798
§ 371 (c)(1),
(2), (4) Date: Nov. 17, 2009

(87) PCT Pub. No.: WO2007/093741
PCT Pub. Date: Aug. 23, 2007

(65) Prior Publication Data
US 2010/0067310 A1    Mar. 18, 2010

(30) Foreign Application Priority Data
Feb. 14, 2006  (FR) ...................... 06 50525

(51) Int. Cl.
*H01L 29/792* (2006.01)
(52) U.S. Cl. .......... 257/324; 257/336; 257/408
(58) Field of Classification Search .......... 257/408, 257/336, 900, 324, E21.135, E21.153; 438/291, 438/300, 301; 365/185.27, 185, 18, 51, 63
See application file for complete search history.

(56) References Cited

U.S. PATENT DOCUMENTS

| | | | |
|---|---|---|---|
| 6,555,437 B1 * | 4/2003 | Yu ................................ | 438/300 |
| 6,724,660 B2 * | 4/2004 | Skotnicki et al. ........ | 365/185.27 |
| 6,780,776 B1 * | 8/2004 | Qi et al. ....................... | 438/706 |
| 7,064,399 B2 * | 6/2006 | Babcock et al. .............. | 257/408 |
| 7,259,083 B2 * | 8/2007 | Menon et al. ................ | 438/586 |
| 2002/0097608 A1 | 7/2002 | Skotnicki et al. | |
| 2005/0001265 A1 | 1/2005 | Shiraki et al. | |

FOREIGN PATENT DOCUMENTS

JP  2005-26664  1/2005
WO  WO 2004/053937 A2  6/2004

OTHER PUBLICATIONS

International Search Report from corresponding International Application No. PCT/FR2007/050798, filed Feb. 14, 2007.
Monfray S et al: "SON (silicon-on-nothing) technological CMOS platform: highly performant devices and SRAM cells" Electron Devices Meeting, 2004. IEDM Technical Digest. IEEE International San Francisco, CA, Dec. 13-15, 2004, Piscataway, NJ, USA, IEEE, pp. 635-638, XPOI0788873.
Ranica R et al: "A New 40-NM SONOS Structure Based on Backside Trapping for Nanoscale Memories" IEEE Transactions on Nanotechnology, IEEE Service Center, Piscataway, NJ, US, vol. 4, No. 5, Sep. 2005 pp. 581-587, XPOO1238537.
Monfray S et al: "Emerging silicon-on-nothing (SON) devices technology" Solid State Electronics, Elsevier Science Publishers, Barking, GB, vol. 48, No. 6, Jun. 2004, pp. 887-895, XP004492637.

* cited by examiner

*Primary Examiner* — David Lam
(74) *Attorney, Agent, or Firm* — Wolf, Greenfield & Sacks, P.C.

(57) ABSTRACT

A MOS transistor comprising a conductive extension of its source region, insulated from its substrate, and partially extending under its channel.

10 Claims, 3 Drawing Sheets

MOS TRANSISTOR WITH A SETTABLE THRESHOLD

FIELD OF THE INVENTION

The present invention relates to the field of MOS transistors and of memory points in an integrated circuit.

DISCUSSION OF THE RELATED ART

In the field of integrated memory points, dual-gate MOS transistors are known, in which a charge can be stored in a floating gate, which modifies the characteristics of the MOS transistor. MNOS-type components are also known, in which charges can be stored in an insulator, preferably at the interface between two insulators such as silicon oxide and nitride.

These two types of memory points as well as other known memory points can be greatly miniaturized but all exhibit various disadvantages.

Memory points made of MOS transistors comprising under their channel region a conductive area fully surrounded with an insulator are also known (refer to Ranica et al, "A new 40-nm SONOS structure based on backside trapping for nanoscale memories", IEEE Transactions on Nanotechnology, Vol. 4, No 5, September 2005, PP. 581-587).

SUMMARY OF THE INVENTION

The present invention aims at forming a MOS transistor with a settable threshold, which can form a memory point,
- capable of being powered at low-voltage, in read mode as well as in write and erase mode,
- which requires a low power for write and erase operations,
- which exhibits a low leakage or, in other words, a long retention time, that is, in which the programmed or unprogrammed state can remain for a very long time, for example, several years or even tens of years,
- very fast in read mode as well as in write mode,
- that can be made in very small dimensions, and
- simple to manufacture in a way compatible with usual technologies for forming complementary MOS transistors, whereby a high manufacturing yield is achieved.

To achieve these objects, the present invention provides a MOS transistor comprising a conductive extension of its source region, insulated from its substrate, and partially extending under its channel.

According to an embodiment of the present invention, the insulated extension extends along a length equal to a distance on the order of from one quarter to one third of the channel length.

According to an embodiment of the present invention, said extension is made of polysilicon.

According to an embodiment of the present invention, the insulation of said extension is performed by a multiple-layer structure such as a silicon nitride and silicon oxide bilayer.

The present invention also provides a method for programming a memory point formed of a MOS transistor such as hereabove, comprising the flowing of a current from the source to the drain, whereby carriers are trapped in the insulator of said extension. A method for erasing a programmed memory point comprises, while the transistor is not turned on, biasing the source to extract the charges trapped in the insulator.

The present invention also provides a method for manufacturing a transistor such as described hereabove, comprising under a single-crystal silicon layer, a layer selectively etchable with respect to this single-crystal silicon layer, this method comprising the steps of forming a gate structure; anisotropically etching the single-crystal silicon layer and the selectively etchable layer, by using the gate structure as a mask; laterally etching the selectively etchable layer; filling the eliminated portions of the selectively etchable layer with an insulator and a conductor; and forming source and drain regions, the source region being in contact with said conductor.

According to an embodiment of the present invention, the selectively etchable layer is a single-crystal silicon-germanium layer formed on single-crystal silicon.

BRIEF DESCRIPTION OF THE DRAWINGS

The foregoing and other objects, features, and advantages of the present invention will be discussed in detail in the following non-limiting description of specific embodiments in connection with the accompanying drawings.

DETAILED DESCRIPTION

Figure 1:
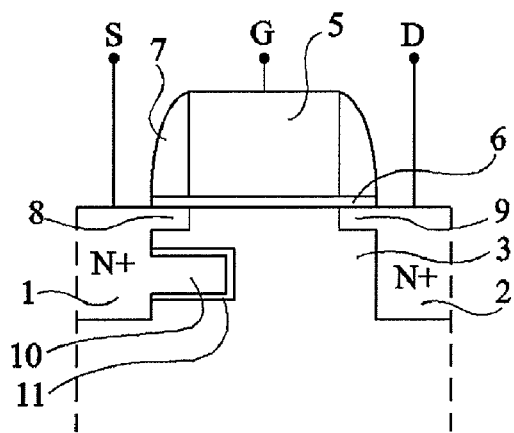
FIG. 1 is a very simplified cross-section view of a MOS transistor with a threshold that can be modified according to the present invention.

Same elements have been designated with same reference numerals in the different drawings and, further, as usual in the representation of integrated circuits, the various drawings are not to scale.

FIG. 1 very schematically shows a conventional MOS transistor structure modified according to the present invention.

The conventional MOS transistor comprises heavily-doped source and drain regions 1 and 2 of a first conductivity type, for example, N+, separated by a region 3 of the opposite conductivity type. A channel can be formed in the upper portion of region 3 under the effect of a conductive gate 5 insulated from the channel by a thin insulating layer 6. Conventionally, the gate is surrounded with spacers 7 under which are formed lightly-doped source and drain extensions 8 and 9 (LDD) of the same conductivity type as the source and the drain. A MOS transistor, with an N channel in the shown example, is obtained, having respective source, drain, and gate terminals S, D, and G.

This transistor is likely to have various alternatives currently used for the forming of MOS transistors and among which the following can be mentioned as an example:
- gate 5 may be made of polysilicon, of polysilicon topped with a silicide layer, or even be totally siliconized,
- gate 5 may be metallic,
- the upper portions of source and drain regions 1 and 2 may be siliconized,
- the transistor may be formed, as shown, on a bulk silicon substrate, or on a silicon layer resting on an insulating layer (SOI),
- each transistor is separated from the neighboring transistors by one or the other of various known techniques, for example, by the forming of an insulating layer extending down to the deep insulating layer in the case of an SOI-type structure or, in the case of a structure on bulk silicon, by trenches filled with an insulator to form, for example, separations between STI-type (shallow trench insulation) transistors,

. . .

In current technologies, the MOS transistor will for example have a gate length of 65 nm, the spacers extending approximately 30 nm beyond the gate.

The present invention provides modifying such a conventional MOS transistor by adding on its source side a conductive finger 10 extending under part of the length of the transistor channel and surrounded with a layer of at least one insulating material 11. Conductive finger 10 for example extends along a length from one quarter to one third of the length of the transistor channel. It should be understood that, widthwise, this finger extends substantially across the gate width.

For the dimensions of MOS transistors indicated hereabove as an example, finger 10 will have a length from the source of at least 50 nm, to extend under the channel beyond source extension area 8. This finger will be at a depth with respect to gate insulator 6 of approximately 10 nm.

In the normal state, for a depletion N-channel MOS transistor, when the drain is positively biased with respect to the source and the gate is positively biased, a current flows from the drain to the source (the electrons run from the source to the drain). If the MOS transistor is used as a memory point, this operating mode is called the read mode. The source may for example be grounded, the drain may be set to a low voltage, for example, 0.1 volt, and the gate may be set to a voltage from 0.5 to 1 volt. Further, although this has not been described previously, the substrate in which the transistor is formed and in the upper portion of which the channel forms is preferably biased to ground. To achieve this, the entire substrate is grounded in the case of a bulk substrate. Various means for biasing the substrate in the case where it is a portion of a silicon layer on an insulating layer may also be found.

To be programmed (have its threshold voltage modified), the above-described component is reverse-biased in non-standard fashion, that is, its source is set to a voltage greater than that of its drain. For example, the drain is grounded and the source is set to a voltage on the order of from 1 to 1.5 volts for a transistor having the above-described dimensions, the gate being set to a positive voltage. Then, the transistor operates as a mirror, that is, the current flows from its source to its drain or the charge carriers, say the electrons for an N-channel transistor, flow from the drain to the source. However, the electrons are attracted, at least partly, by conductive finger 10 and electrons come to be trapped in insulator 11. In the case where this insulator is formed of a bilayer of insulators having different band gaps, such as a silicon nitride and silicon oxide bilayer, the electrons trap in extremely stable fashion at the interface between the two insulating layers.

It should be underlined that this programming or writing then occurs while a relatively low voltage (from 1 to 1.5V), on the order of magnitude of the voltages currently used in a circuit comprising submicronic CMOS transistors, is applied to the source.

To bring the device back to its initial threshold voltage (erase operation), the drain and the gate (as well as the substrate) are set to a reference voltage, currently the ground, and a positive voltage is applied to the source. Then, the source attracts the electrons which are trapped in the insulator, or at the interface between the insulators, surrounding the conductive finger. Again, it should be underlined that, for the erasing voltage, there is no need to use high voltages and that voltages on the order of from 1 to 1.5 volts are quite sufficient.

Tests and simulations have shown that with a transistor having dimensions on the order of those indicated hereabove, a current substantially 10 times as high in the unprogrammed state as in the programmed state is obtained in the read mode for a given drain-source voltage and gate voltage. Thus, the two states according to the present invention can be clearly made out.

As compared with most known devices, the device according to the present invention has the advantages of requiring a low power and low voltages for its reading, its programming and its erasing.

Like floating-gate transistors or MNMOS devices, the device according to the present invention has the advantage of a long charge retention time (possibly several years) with no refreshment.

Further, the state of the device according to the present invention can be very rapidly switched and this device can be formed in very small dimensions.

The fact for the programming and erasing mechanisms to occur at low voltages results in that a great number of programming and erasing operations can be performed with no degradation of the device.

It will be shown hereafter that the manufacturing of a device according to the present invention is compatible with current CMOS transistor manufacturing methods and adds no manufacturing step with respect to the forming of such transistors, especially in the context of manufacturing methods in which a step of forming of a silicon-germanium layer is used.

An example of the forming of a transistor according to the present invention will now be described as an example only in relation with FIGS. 2A to 2E. In this example, two fingers respectively extending from the source and the drain are formed but, as discussed previously, only the source finger is used (using the conventional definition of the source and the drain of a MOS transistor).

Figure 2A:
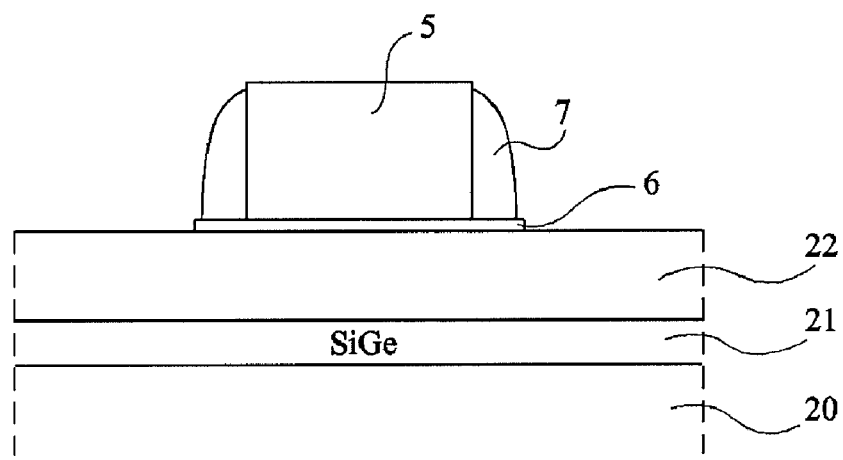
FIGS. 2A to 2E are cross-section views illustrating successive steps of the manufacturing of a MOS transistor according to an embodiment of the present invention.

At the step illustrated in FIG. 2A, a gate structure comprising a gate 5 on a gate insulator 6 has been formed on a substrate portion successively containing a single-crystal silicon layer 20, a single-crystal silicon-germanium layer 21, and a single-crystal silicon layer 22. The gate is surrounded with a spacer 7. As an example of order of magnitude, silicon-germanium layer 21, as well as upper single-crystal silicon layer 22, may have a thickness on the order of from 10 to 20 nm.

Figure 2B:
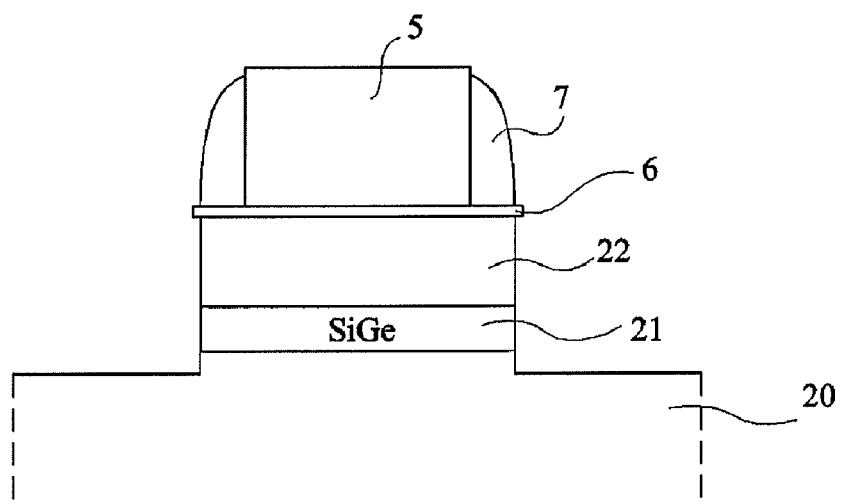

At the step illustrated in FIG. 2B, the gate structure of FIG. 2A has been used as a mask to etch in anisotropic fashion successively silicon layer 22, silicon-germanium layer 21 and possibly a small thickness of lower silicon layer 20. Lower silicon layer 20 is the upper portion of a single-crystal silicon wafer or a silicon-on-insulator layer resting on a silicon wafer according to the well-known SOI technique, or other.

Figure 2C:
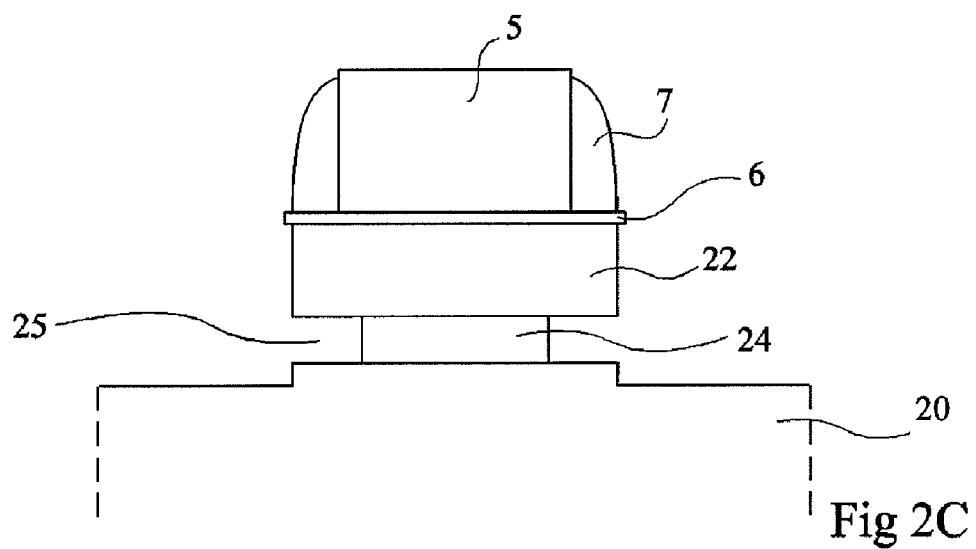

At the step illustrated in FIG. 2C, a selective etching of the silicon-germanium is performed, where this etching may be an isotropic etching and enables decreasing the length of silicon-germanium layer 21 to leave in place a silicon-germanium portion 24 of smaller length than gate length 5. There then exist openings 25 between the two silicon layers 20 and 22 on the two sides of the gate.

Figure 2D:
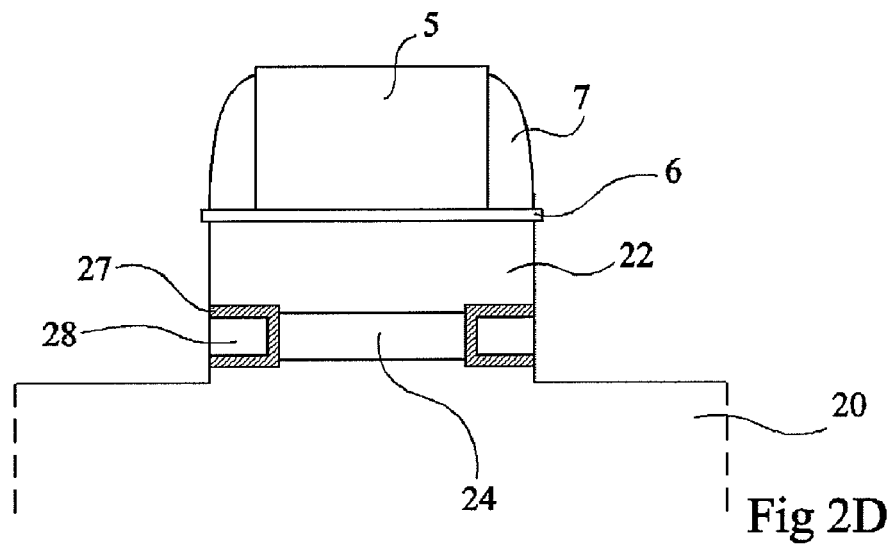

At the step illustrated in FIG. 2D, an insulating layer 27 and a conductive layer 28 are formed inside of openings 25. Insulating layer 27 may result from a thermal oxidation (silicon oxide) followed by a silicon nitride deposition. This or these insulating layer(s) may be made of other materials, for example, silicon, nitride, germanium nanocrystals, insulator multilayers. Conductive layer 28 may be made of polycrystalline, amorphous, or single-crystal silicon. Various methods known in the art may be used to deposit, then eliminate outside of openings 25 the used filling materials. Conformal depositions may for example be performed over the entire surface of the component, and followed by an etching.

Figure 2E:
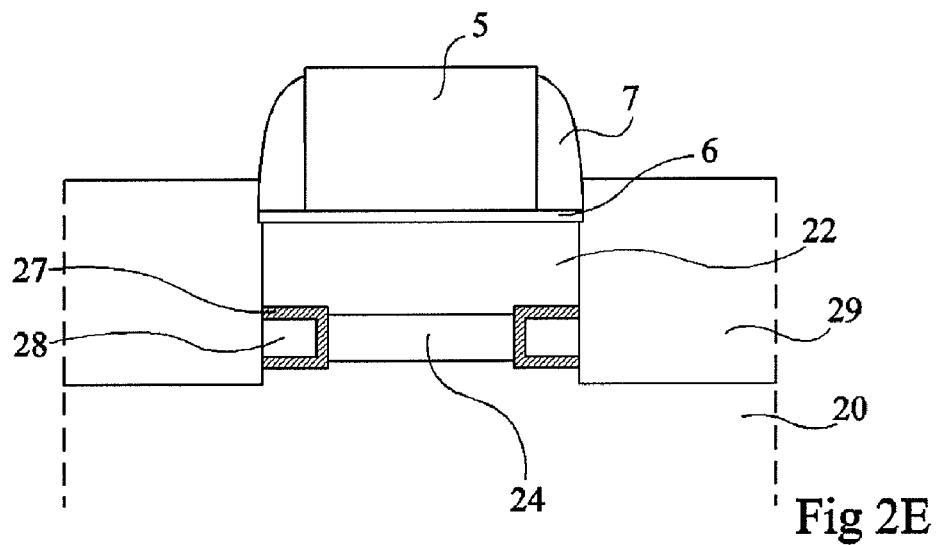

At the step illustrated in FIG. 2E, the recesses formed at the step of FIG. 2B in layers 22, 21, and 20 on either side of gate stacking 5 are filled with single-crystal silicon 29. This is normally done by selective epitaxy from silicon 20—and the lateral walls of silicon layer 22.

Figure 3:
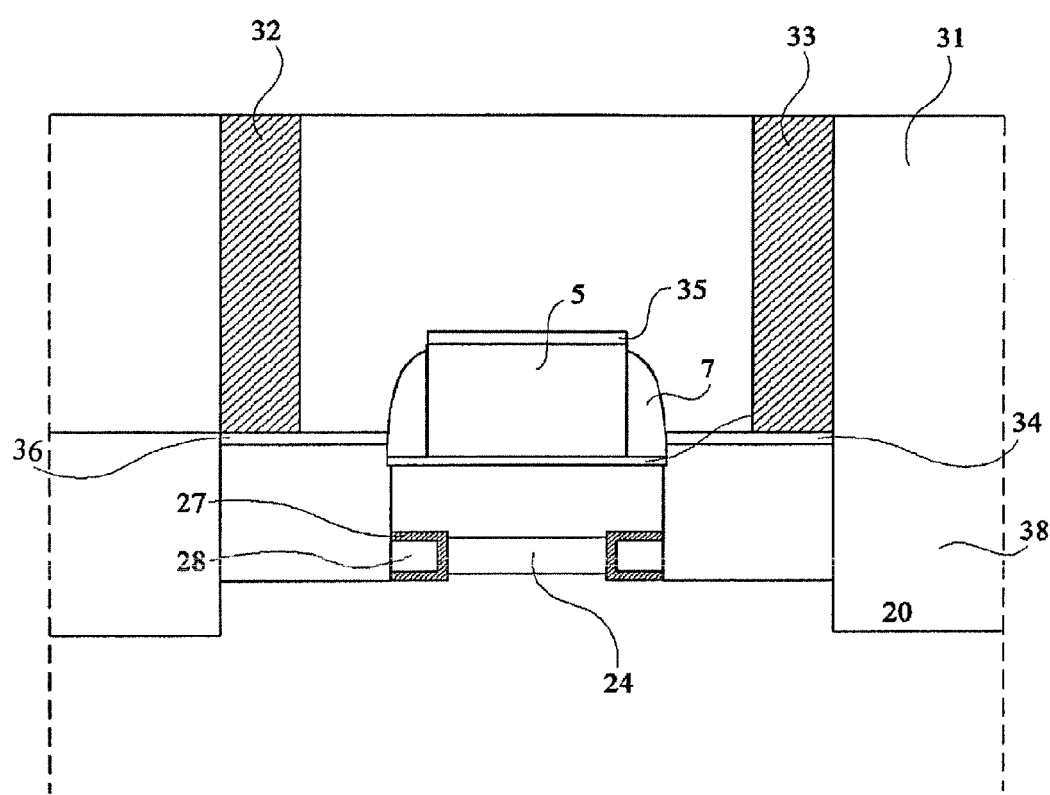
FIG. 3 shows an example of a MOS transistor obtained by the method illustrated in FIGS. 2A to 2E.

The obtained structure is illustrated in FIG. 3 in which same reference numerals designate same elements as in FIGS. 2A to 2E. Insulating trenches delimiting the active area in which the transistor according to the present invention is formed have further been shown. The structure is coated with an insulating layer 31 through which are formed source and drain contact vias 32 and 33. Silicide layers 36, 34, and 35 have also been shown above the source, the drain, and the gate. The gate contact is not shown and is conventionally laterally transferred.

It should be well understood that the above-described embodiment is likely to have many variations. For example, if it is considered that the existence of two fingers, respectively of source and drain, may be disturbing, before the step illustrated in FIG. 2B, the structure will be masked on the side where the drain is to be formed to avoid etching it on this side. Thus, only the source finger will be formed.

The forming of the insulated finger(s) has been described as resulting from the filling of a recess formed in silicon-germanium selectively etched with respect to silicon. Other selectively etchable materials may be used.

The present invention is likely to have various alterations, modifications, and improvements which will readily occur to those skilled in the art. In particular, the present invention has been described in the context of an N-channel MOS transistor; it will apply with the necessary adaptations to a P-channel MOS transistor.

The present invention has been described in the context of an application to the forming of a two-state memory point. However, the described device more generally consists in a MOS transistor with a threshold settable according to the amount of charges injected into the insulator of a conductive finger penetrating under its gate. And this MOS transistor with a settable threshold will find other applications.

Transistors according to the present invention may be assembled in an array network. They may also form elements of a network of logic gates.

The invention claimed is:

1. A MOS transistor comprising a source region, a drain region, a gate, a silicon region located between the source and drain regions and configured for formation of a channel between the source and drain regions, and a conductive extension of the source region, insulated from the silicon region and partially extending under the channel.

2. The MOS transistor of claim 1, wherein the insulated extension extends along a length equal to a distance on the order of from one quarter to one third of the channel length.

3. The MOS transistor of claim 1, wherein said extension is made of polysilicon.

4. The transistor of claim 1, wherein the insulation of said extension comprises a multiple-layer structure.

5. A MOS transistor comprising:
 a source region of a first conductivity type;
 a drain region of the first conductivity type;
 a silicon region of a second conductivity type between the source region and the drain region, the silicon region configured for formation therein, in response to a gate voltage, of a channel between the source region and the drain region;
 a conductive gate above the channel and insulated from the channel;
 a conductive finger extending from the source region into the silicon region under at least a part of the channel; and
 an insulating layer separating the conductive finger from the silicon region.

6. A MOS transistor as defined in claim 5, wherein the source region further includes a source extension under a spacer surrounding the gate and wherein the conductive finger extends into the silicon region beyond the source extension.

7. A MOS transistor as defined in claim 5, wherein the conductive finger extends into the silicon region along a length from one quarter to one third of a length of the channel.

8. A MOS transistor as defined in claim 5, wherein the insulating layer comprises a multiple layer structure.

9. A MOS transistor as defined in claim 5, wherein the conductive finger comprises polysilicon.

10. A MOS transistor as defined in claim 5, further comprising a gate insulator between the gate and the channel, wherein the conductive finger is at a depth of approximately 10 nanometers with respect to the gate insulator.

* * * * *